(12) United States Patent
White

(10) Patent No.: US 8,441,322 B1
(45) Date of Patent: May 14, 2013

(54) BROADBAND LINEARIZATION BY ELIMINATION OF HARMONICS AND INTERMODULATION IN AMPLIFIERS

(75) Inventor: Mikel J. White, Murphy, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/307,207

(22) Filed: Nov. 30, 2011

(51) Int. Cl.
*H03F 3/04* (2006.01)

(52) U.S. Cl.
USPC ............ 330/310; 330/149; 330/311; 330/253

(58) Field of Classification Search ................... 330/310, 330/149, 311, 253
See application file for complete search history.

(56) References Cited

U.S. PATENT DOCUMENTS

| | | | |
|---|---|---|---|
| 5,847,600 A * | 12/1998 | Brooks et al. | 330/9 |
| 6,037,837 A | 3/2000 | Miyaji et al. | |
| 6,417,737 B1 * | 7/2002 | Moloudi et al. | 330/301 |
| 6,570,446 B1 * | 5/2003 | Ling | 330/252 |
| 6,958,647 B2 | 10/2005 | Rabinovich et al. | |
| 2003/0179041 A1 | 9/2003 | Weldon | |
| 2008/0036536 A1 | 2/2008 | Khorramabadi | |
| 2010/0039174 A1 * | 2/2010 | Teetzel | 330/149 |
| 2010/0225389 A1 | 9/2010 | Teetzel | |
| 2010/0244963 A1 | 9/2010 | Hsu et al. | |
| 2011/0304392 A1 * | 12/2011 | Zanchi | 330/253 |
| 2012/0013404 A1 * | 1/2012 | Ngai | 330/254 |

OTHER PUBLICATIONS

Seong-Sik Song et al.,"A Highly Linear Wideband CMOS Low-Noise Amplifier Based on Current Amplification for Digital TV Tuner Applications," IEEE Microwave and Wireless Components Letters, vol. 18, No. 2, pp. 118-120, Feb. 2008.
Eureopean Patent Office; Extended European Search Report; Reference: BR076467/ND/SDO; Application No. 12185519.1-1233; Mailed: Janauary 31, 2013; pp. 1-6.

* cited by examiner

*Primary Examiner* — Patricia Nguyen
(74) *Attorney, Agent, or Firm* — Cantor Colburn LLP

(57) ABSTRACT

An amplifier device includes an initial amplifier stage configured to receive a differential input signal at a first leg and a second leg; a final amplifier stage coupled to outputs of the initial amplifier stage, the final amplifier stage including a primary signal amplifier and an error amplifier in each of the first and second legs; and wherein an output of the error amplifier of the first leg is combined with an output of the primary signal amplifier in the second leg, and an output of the error amplifier of the second leg is combined with an output of the primary signal amplifier in the first leg.

10 Claims, 2 Drawing Sheets

BROADBAND LINEARIZATION BY ELIMINATION OF HARMONICS AND INTERMODULATION IN AMPLIFIERS

BACKGROUND

The present disclosure relates generally to electronic communications systems and, more particularly, to broadband linearization by elimination of harmonics and intermodulation in amplifiers.

In electronic communication systems, it is often the case that groups of information signals are amplified and transmitted simultaneously. For example, a cellular radio base station transmitter may transmit signals to several active receiving mobile stations within a single geographic cell. These signals may appear at multiple predetermined frequencies in such multi-carrier signals. Similarly, a satellite communications transponder may amplify and transmit a large number of information signals destined for various participating remote stations. Some communications systems may employ an encoding scheme such as frequency division multiple access (FDMA), in which information signals are modulated on signal carriers occupying several frequency channels within an allocated frequency band. Here, measures are taken so as to avoid inter-channel interference which may corrupt signal transmissions.

One possible source of such cross-channel interference is known as intermodulation distortion (IMD), which may result when two or more signals of different frequencies are mixed. For example, if two carriers of different frequencies are amplified using a non-linear amplifier, spurious outputs may occur at the sum and difference of integer multiples of the original carrier frequencies. IMD tends to cause problems in transmitters that amplify and send out multicarrier signals, as it often falls in the spectrum between two of the carrier signals. Further, IMD is generally difficult to filter out, because such a filter would likely also filter out the carrier signal, removing that signal and the associated data from the signal that is ultimately amplified by the power amplifier. In addition to environmental and aging factors, the observed IMD performance of a power amplifier is sensitive to changes in output power, the number of carriers and their frequency separation.

Existing approaches to suppressing intermodulation and distortion products have come at a cost of lower power efficiency, higher complexity and component cost, and/or effectiveness for narrow band systems only.

SUMMARY

In an exemplary embodiment, an amplifier device includes an initial amplifier stage configured to receive a differential input signal at a first leg and a second leg; a final amplifier stage coupled to outputs of the initial amplifier stage, the final amplifier stage including a primary signal amplifier and an error amplifier in each of the first and second legs; and wherein an output of the error amplifier of the first leg is combined with an output of the primary signal amplifier in the second leg, and an output of the error amplifier of the second leg is combined with an output of the primary signal amplifier in the first leg.

In another embodiment, a method of performing broadband linearization for an amplifier device includes receiving a differential input signal at a first leg and a second leg of an initial amplifier stage; coupling outputs of the initial amplifier stage to a final amplifier stage, the final amplifier stage comprising a primary signal amplifier and an error amplifier in each of the first and second legs; and combining an output of the error amplifier of the first leg with an output of the primary signal amplifier in the second leg, and combining an output of the error amplifier of the second leg with an output of the primary signal amplifier in the first leg.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
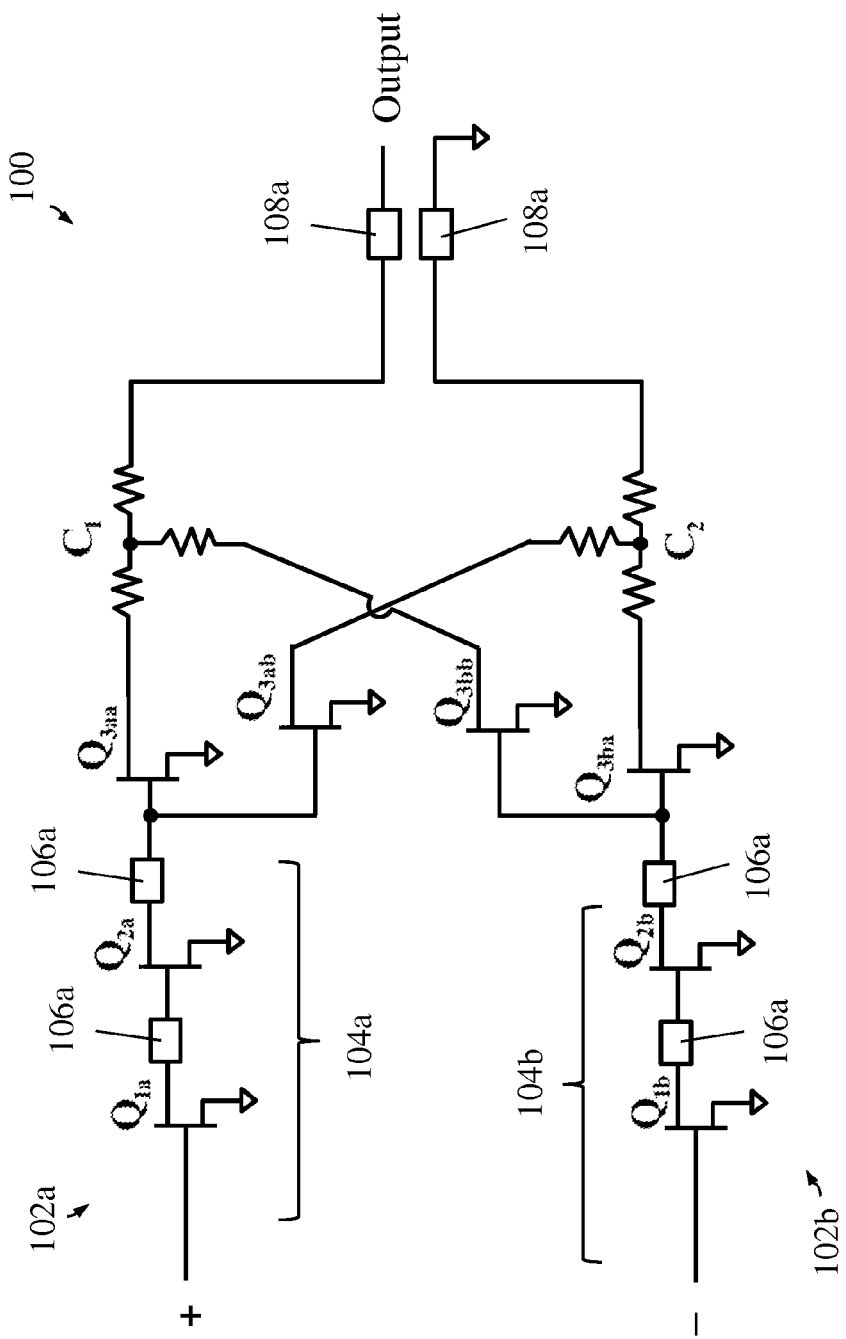
FIG. 1 is a schematic diagram of a differential, feed forward amplifier circuit having cross-strapped error amplifiers, in accordance with an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature(s) being described. Also, the description is not to be considered as limiting the scope of the embodiments described herein.

As indicated above, intermodulation products (typically third order products) resulting from two relatively strong signals may disrupt transmission of a third relatively weak signal being transmitted on a carrier having a frequency equal to the frequency of the intermodulation product. Various solutions have been proposed for improving linearity and reducing inter-channel effects in multicarrier amplifiers. One such solution is a feed forward amplifier circuit, in which two or more feed forward loops are used to cancel distortion. Alternative feed forward amplifier designs may utilize more loops to further reduce distortion.

In a first loop, a portion of the signals at the input to the amplifier are fed forward and, following suitable amplitude and phase adjustment, are subtracted from the amplifier output to generate an error signal. The error signal is proportional to distortion components of the output. The first loop that generates the error signal is known as the signal cancellation loop. The error signal is then amplified, phase adjusted and subtracted from the amplifier output to give a corrected signal output with reduced distortion levels. This portion of the circuit is known as the error cancellation loop.

In one design, a "pilot tone" is introduced to the first loop of the feed forward amplifier (i.e., the signal cancellation loop). Then, the amplitude and phase adjustments in the error cancellation loops are performed by varying the amplitude and phase until a desired output is obtained. The adjustments made in this manner, however, are inherently narrowband, typically giving optimal amplifier performance across a narrow frequency band.

Another technique for reducing distortion involves the addition of more cancellation loops to further improve IMD cancellation in a feed forward amplifier. The additional loops typically have additional phase and gain controls that introduce complexity to overall amplifier adjustment, as well as additional cost. However, any small improvement in performance thus obtained is generally not worth the extra complexity and cost of utilizing multiple feed forward loops.

Still another technique for broadband systems involves the use of baluns to eliminate second order harmonic signals. On the other hand, such devices have no effect on IMD or higher order harmonic distortion signals. Further techniques include, but are not limited to, differential amplifiers using a current-mirror approach in complementary metal oxide semiconductor (CMOS) devices, multigated transistors and derivative superposition, and on-chip diplexers.

Accordingly, disclosed herein is an amplifier design and topology that provides broadband linearization by elimination of harmonics and intermodulation distortion. In brief, the embodiments utilize a differential, feed forward amplifier design that incorporates cross-strapped error amplifiers. That is, the feed forward error signal generated in the first leg of the differential signal pair is fed to and combined with the amplified signal of the second leg, and vice versa. A broadband pair of baluns may also be used at the outputs of the amplifier to further reduce second order harmonic distortion while combining the fundamental. As a result, the amplifier produces a significantly reduced distortion signal over a broad frequency range.

Referring to FIG. 1, there is shown a schematic diagram of a differential, feed forward amplifier circuit 100 having cross-strapped error amplifiers, in accordance with an exemplary embodiment. The amplifier circuit 100, being a differential amplifier, includes a first leg 102a and a second leg 102b. Included within the first leg 102a is a first initial amplifier stage 104a that includes, for example, amplifying field effect transistors (FETs) $Q_{1a}$, $Q_{2a}$ and associated matching output circuit devices 106a. It should be understood, however, that a different number of transistor devices or transistor device types may be used in the first initial amplifier stage 104a. Similarly, the second leg 102a includes a second initial amplifier stage 104b that includes, for example, amplifying transistors $Q_{1b}$, $Q_{2b}$ and associated matching output circuit devices 106b.

Further downstream of the first and second initial amplifier stages are first and second final amplifier stages. Here, the final amplifier stages in each leg includes a primary signal amplifier and an error amplifier that is split from (i.e., has the same input as) the primary signal amplifier. In the first leg 102a, the primary signal amplifier is denoted $Q_{3aa}$ and the error amplifier is denoted as $Q_{3ab}$, and in the second leg 102b the primary signal amplifier is denoted as $Q_{3ba}$ while the error amplifier is denoted $Q_{3bb}$. Notably, the output of the error amplifiers $Q_{3ab}$ and $Q_{3bb}$ are cross-strapped or cross-coupled with respect to the first and second legs. That is, the output of error amplifier $Q_{3bb}$ is combined with the output of the primary signal amplifier $Q_{3aa}$ of the first leg 102a via a first coupler C1. Correspondingly, the output of error amplifier $Q_{3ab}$ is combined with the output of the primary signal amplifier $Q_{3ba}$ of the second leg 102b via a second coupler C2. The combined output signals from the first and second legs 102a, 102b, are then coupled to respective baluns 108a, 108b.

As the amplifier circuit 100 is a differential amplifier, an input signal thereto is fed differentially as illustrated in FIG. 1 such as, for example, by an antenna feed or using a balun (not shown). The initial amplifier stages 104a, 104b set the system noise factor (NF), assuming the gain of the devices is sufficiently high. The final amplifier stages (again, for each leg including a primary signal amplifier and an error amplifier) have different linearity characteristics with respect to signal and error. That is, the two amplifier devices (signal, error) in the final stage are biased differently with respect to one another such that more non-linear signals are forced to the error amplifier ($Q_{3ab}$, $Q_{3bb}$) than to the primary signal amplifier ($Q_{3aa}$, $Q_{3ba}$).

Additionally, with respect to the final amplifier stages, power is split between the primary signal amplifier ($Q_{3aa}$, $Q_{3ba}$) and its respective error amplifier ($Q_{3ab}$, $Q_{3bb}$). In one embodiment, this split could be implemented by a reactive match with an equal split. Alternatively, a coupler (not shown) could also be used as long as phase change through both paths of the coupler is identical. In any case, the error amplifiers ($Q_{3ab}$, $Q_{3bb}$) are selected so as to have reduced primary signal to non-linear signal components. That is, the non-linear distortion signals of the error amplifiers ($Q_{3ab}$, $Q_{3bb}$) have lower dBc (decibels relative to the carrier) values than those of the primary signal amplifiers ($Q_{3aa}$, $Q_{3ba}$).

As indicated previously, the amplified error signals are cross-strapped to the coupler and combined with the primary signal of the other leg in the differential amplifier. The coupler ratio is set to equalize the third order and intermodulation products, thereby creating a cancellation of these non-linear signals. Depending on how far the dBc level has been reduced, there may be some primary signal loss. Finally, the differential output signals, having reduced/eliminated odd-order and odd-order intermodulation signals by virtue of the cross-strapped error amplifiers are combined in the baluns 108a, 108b to eliminate the even-order signals.

Figure 2:
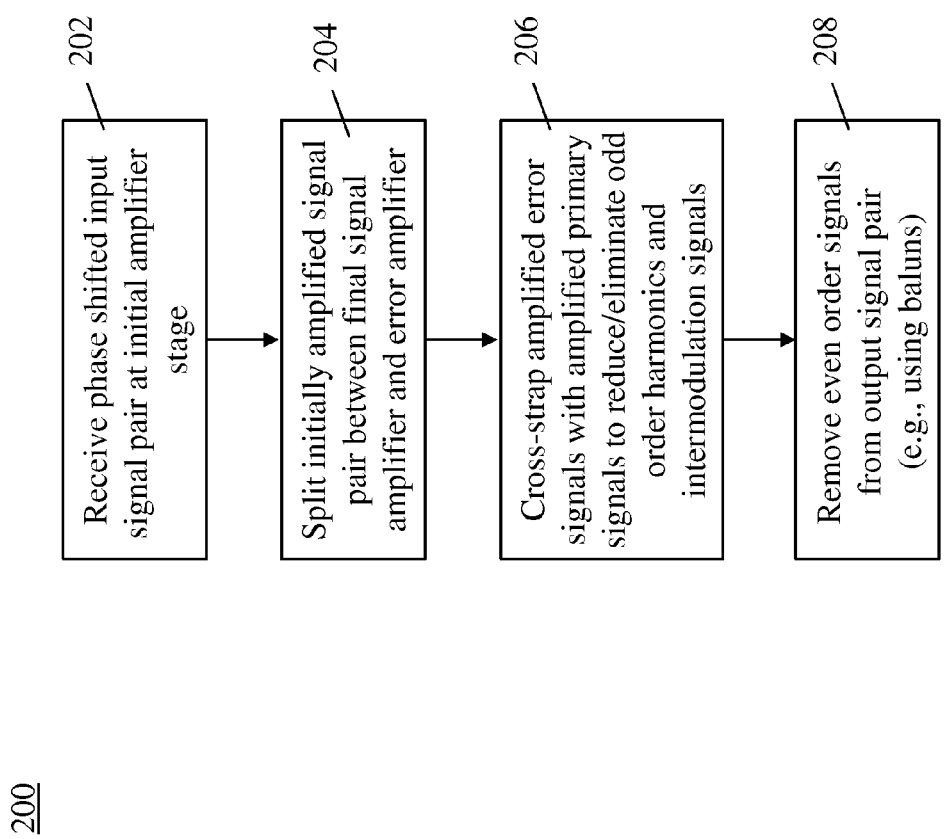
FIG. 2 is a flow diagram illustrating a method of performing elimination of harmonics and intermodulation in amplifiers, in accordance with an exemplary embodiment.

FIG. 2 is a flow diagram illustrating a method 200 of performing elimination of harmonics and intermodulation in amplifiers (such as in the amplifier 100 of FIG. 1), in accordance with an exemplary embodiment. In block 202, a phase shifted input signal pair (i.e., a differential input signal) is received at an initial amplifier stage. The phase shifted differential signal pair may be fed to the initial amplifier stage through the use of, for example, an antenna feed or possibly with a balun. Once initially amplified, the differential signal pair is split on each leg between a final signal amplifier and an error amplifier, as indicated in block 204. The final signal amplifier and error amplifier have different linearity characteristics with respect to one another. In contrast to previous feedforward schemes, the output of each error amplifier is cross-strapped and combined with the output of the final amplifier in the opposite leg of the differential pair, as reflected in block 206. This results in the reduction or elimination of odd order harmonics and intermodulation signals. Finally, as indicated in block 208, even order signals are reduced or removed from the output differential signal though coupling to baluns.

As will thus be appreciated, the above described embodiments improve linearity for broadband receiver systems without the need for additional DC power. Whereas conventional feed forward techniques, offer limited bandwidth due to phase and amplitude matching while achieving a 180° shift of harmonics, the present embodiments take advantage of a differential feed to achieve a 180° phase shift of distortion products. By using cross-strapping with identical matching circuits on outputs of the initial amplifier stage or stages, broadband performance of the cancellation circuit is ensured. Furthermore, tailoring of the linearity of devices also reduces primary signal loss.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. An amplifier device, comprising:
an initial amplifier stage configured to receive a differential input signal at a first leg and a second leg;
a final amplifier stage coupled to outputs of the initial amplifier stage, the final amplifier stage comprising a primary signal amplifier and an error amplifier in each of the first and second legs;
wherein an output of the error amplifier of the first leg is combined with an output of the primary signal amplifier in the second leg, and an output of the error amplifier of the second leg is combined with an output of the primary signal amplifier in the first leg;
a first coupler configured within in the first leg to combine the output of the error amplifier of the first leg with the output of the primary signal amplifier in the second leg; and
a second coupler configured within in the second leg to combine the output of the error amplifier of the second leg with the output of the primary signal amplifier in the first leg, wherein the first and second couplers are configured to cancel odd order harmonics signals and intermodulation products.

2. The device of claim 1, wherein the primary signal amplifier and error amplifier of each final stage are biased so as to force more non-linear signals to the inputs of the error amplifiers with respect to the inputs of the primary signal amplifiers.

3. The device of claim 1, wherein the error amplifiers have reduced primary signal to non-linear signal components with respect to the primary signal amplifiers.

4. An amplifier device, comprising:
an initial amplifier stage configured to receive a differential input signal at a first leg and a second leg;
a final amplifier stage coupled to outputs of the initial amplifier stage, the final amplifier stage comprising a primary signal amplifier and an error amplifier in each of the first and second legs;
wherein an output of the error amplifier of the first leg is combined with an output of the primary signal amplifier in the second leg, and an output of the error amplifier of the second leg is combined with an output of the primary signal amplifier in the first leg; and
a balun coupled to outputs of the final amplifier stage.

5. The device of claim 4, wherein the balun coupled to outputs of the final amplifier stage is configured to eliminate even order signals.

6. A method of performing broadband linearization for an amplifier device, the method comprising:
receiving a differential input signal at a first leg and a second leg of an initial amplifier stage;
coupling outputs of the initial amplifier stage to a final amplifier stage, the final amplifier stage comprising a primary signal amplifier and an error amplifier in each of the first and second legs;
combining an output of the error amplifier of the first leg with an output of the primary signal amplifier in the second leg, and combining an output of the error amplifier of the second leg with an output of the primary signal amplifier in the first leg;
combining the output of the error amplifier of the first leg with the output of the primary signal amplifier in the second leg with a first coupler configured within in the first leg; and
combining the output of the error amplifier of the second leg with the output of the primary signal amplifier in the first leg with a second coupler configured within in the second leg, wherein the first and second couplers are configured to cancel odd order harmonics signals and intermodulation products.

7. The method of claim 6, wherein the primary signal amplifier and error amplifier of each final stage are biased so as to force more non-linear signals at the outputs of the error amplifiers with respect to the outputs of the primary signal amplifiers.

8. The method of claim 6, wherein the error amplifiers have reduced primary signal to non-linear signal components with respect to the primary signal amplifiers.

9. A method of performing broadband linearization for an amplifier device, the method comprising:
receiving a differential input signal at a first leg and a second leg of an initial amplifier stage;
coupling outputs of the initial amplifier stage to a final amplifier stage, the final amplifier stage comprising a primary signal amplifier and an error amplifier in each of the first and second legs;
combining an output of the error amplifier of the first leg with an output of the primary signal amplifier in the second leg, and combining an output of the error amplifier of the second leg with an output of the primary signal amplifier in the first leg; and
coupling outputs of the final amplifier stage to a balun.

10. The method of claim 9, wherein the balun coupled to outputs of the final amplifier stage is configured to eliminate even order signals.

* * * * *